(12) United States Patent
Kawano et al.

(10) Patent No.: US 8,890,237 B2
(45) Date of Patent: Nov. 18, 2014

(54) POWER SEMICONDUCTOR DEVICE

(75) Inventors: Takahiro Kawano, Kanagawa-ken (JP); Hideki Okumura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 13/419,396

(22) Filed: Mar. 13, 2012

(65) Prior Publication Data

US 2013/0069145 A1 Mar. 21, 2013

(30) Foreign Application Priority Data

Sep. 16, 2011 (JP) ................................. 2011-203791

(51) Int. Cl.
*H01L 29/78* (2006.01)
*H01L 29/06* (2006.01)
*H01L 29/40* (2006.01)
*H01L 23/48* (2006.01)

(52) U.S. Cl.
CPC ............ *H01L 23/48* (2013.01); *H01L 29/7813* (2013.01); *H01L 29/0661* (2013.01); *H01L 29/0653* (2013.01); *H01L 29/7811* (2013.01); *H01L 29/407* (2013.01)
USPC ........................................................ 257/330

(58) Field of Classification Search
CPC .............. H01L 29/813; H01L 29/4236; H01L 29/66734
USPC ............................ 257/329–334; 438/257–259
See application file for complete search history.

(56) References Cited

U.S. PATENT DOCUMENTS

| | | | |
|---|---|---|---|
| 6,621,121 B2 * | 9/2003 | Baliga ............................ | 257/330 |
| 7,087,958 B2 | 8/2006 | Chuang et al. | |
| 7,855,415 B2 | 12/2010 | Challa et al. | |
| 8,394,702 B2 * | 3/2013 | Tai et al. ........................ | 438/270 |
| 2002/0030237 A1 | 3/2002 | Omura et al. | |
| 2005/0029568 A1 | 2/2005 | Tokuda et al. | |
| 2006/0267091 A1 | 11/2006 | Takahashi | |

FOREIGN PATENT DOCUMENTS

| | | |
|---|---|---|
| JP | 2006120807 A | 5/2006 |
| JP | 2007250912 A | 9/2007 |
| JP | 2008016726 A | 1/2008 |
| JP | 2008-085086 | 4/2008 |

OTHER PUBLICATIONS

Japanese Office Action dated Nov. 26, 2013, filed in Japanese counterpart Application No. 2011-203791, 5 pages (with translation).

* cited by examiner

*Primary Examiner* — Matthew W Such
*Assistant Examiner* — Warren H Kilpatrick
(74) *Attorney, Agent, or Firm* — Patterson & Sheridan, LLP

(57) ABSTRACT

A power semiconductor device according to one embodiment includes a first electrode, a semiconductor substrate provided on the first electrode, and an insulating member. A terminal trench is made in the upper surface of the semiconductor substrate in a region including a boundary between a cell region and a terminal region. The semiconductor substrate includes a first portion of a first conductivity type and connected to the first electrode, a second portion of the first conductivity type, a third portion of a second conductivity type provided on the second portion in the cell region and connected to the second electrode, and a fourth portion of the first conductivity type selectively provided on the third portion and connected to the second electrode. The insulating member is disposed between the third portion and the second portion in a direction from the cell region toward the terminal region.

7 Claims, 4 Drawing Sheets

SOURCE POTENTIAL

GATE POTENTIAL

DRAIN POTENTIAL

POWER SEMICONDUCTOR DEVICE

CROSS-REFERENCE TO RELATED APPLICATIONS

This application is based upon and claims the benefit of priority from the prior Japanese Patent Application No. 2011-203791, filed on Sep. 16, 2011; the entire contents of which are incorporated herein by reference.

FIELD

Embodiments described herein relate generally to a power semiconductor device.

BACKGROUND

In recent years, a vertical power MOSFET (Metal-Oxide-Semiconductor Field-Effect Transistor) has been developed in which a drain electrode is connected to the lower surface of a silicon substrate, a source electrode is connected to the upper surface of the silicon substrate, and a gate electrode is buried inside a trench gate formed in the silicon substrate. In such a vertical power MOSFET, it is necessary for the breakdown voltage between the drain and the source to be guaranteed not only in the cell region where the current flows between the drain and the source but also in the terminal region around the cell region. Therefore, when designing the vertical power MOSFET, it is necessary to design the terminal region to realize a prescribed breakdown voltage. Generally, guard ring structures, RESURF structures, field plate structures, and the like are known as structures of the terminal region. However, even when using these structures, there are cases where the necessary terminal breakdown voltage cannot be realized.

DETAILED DESCRIPTION

In general, according to one embodiment, a cell region and a terminal region are set in a power semiconductor device. The device includes a first electrode, a semiconductor substrate, a second electrode, a gate insulating film, a gate electrode and an insulating member. The semiconductor substrate is provided on the first electrode. A cell trench is made in an upper surface of the semiconductor substrate in the cell region. A terminal trench is made in the upper surface of the semiconductor substrate in a region including a boundary between the cell region and the terminal region. A width of the terminal trench is wider than a width of the cell trench. The second electrode is provided on the semiconductor substrate in the cell region. The gate insulating film is provided on an inner surface of the cell trench. The gate electrode is provided in an interior of the cell trench. The insulating member is provided on an inner surface of the terminal trench. The semiconductor substrate includes a first portion of a first conductivity type, a second portion of the first conductivity type, a third portion of a second conductivity type and a fourth portion of the first conductivity type. The first portion is provided in both the cell region and the terminal region. The first portion is connected to the first electrode. The second portion is provided on the first portion in both the cell region and the terminal region to contact the gate insulating film and the insulating member. An effective impurity concentration of the second portion is lower than an effective impurity concentration of the first portion. The third portion is provided on the second portion in the cell region to contact the gate insulating film. The third portion is connected to the second electrode. The fourth portion is selectively provided on the third portion to contact the gate insulating film. The fourth portion is connected to the second electrode. And, the insulating member is disposed between the third portion and the second portion in a direction from the cell region toward the terminal region.

Embodiments of the invention will now be described with reference to the drawings.

First, a first embodiment will be described.

Figure 1:
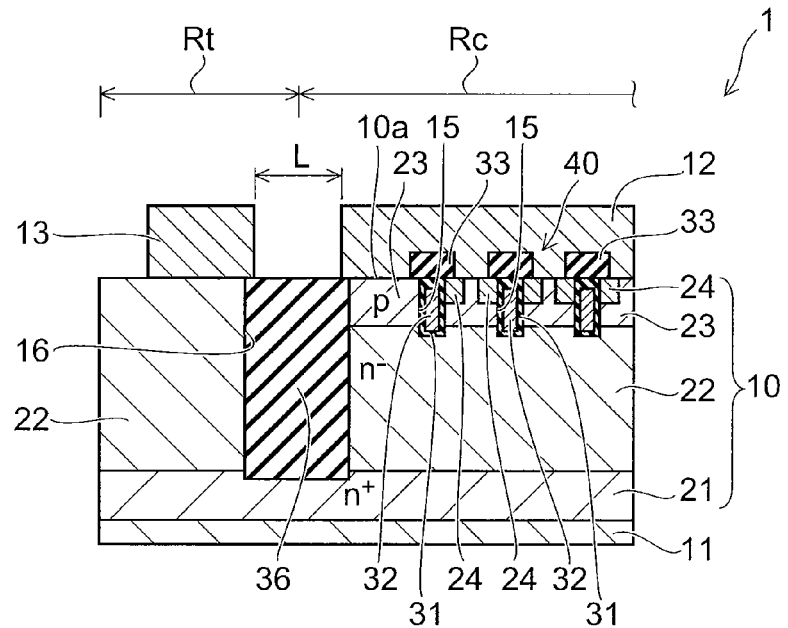
FIG. 1 is a cross-sectional view illustrating a power semiconductor device according to a first embodiment.

FIG. 1 is a cross-sectional view illustrating a power semiconductor device according to the embodiment.

In the power semiconductor device 1 according to the embodiment as illustrated in FIG. 1, a cell region Rc is set in a central portion, and a terminal region Rt is set in an outer circumferential portion, that is, around the cell region Rc. The cell region Rc is a region where a current flows between the drain and the source; and the terminal region Rt is a region where a current is not actively caused to flow. As described below, vertical n-channel MOSFETs are formed in the cell region Rc.

For example, a drain electrode 11 made of a metal is provided in the power semiconductor device 1. The drain electrode 11 is provided in the entire region of the power semiconductor device 1 as viewed from above, that is, in both the cell region Rc and the terminal region Rt. A silicon substrate 10 is provided on the entire region of the drain electrode 11. The silicon substrate 10 is, for example, a semiconductor substrate formed of monocrystalline silicon including an impurity. The lower surface of the silicon substrate 10 contacts the drain electrode 11. For example, a source electrode 12 made of a metal is provided on the silicon substrate 10 in the cell region Rc. For example, a terminal electrode 13 made of a metal is provided on the silicon substrate 10 in the terminal region Rt. The terminal electrode 13 is separated from the source electrode 12. For example, the terminal electrode 13 is connected to the drain electrode 11 via a through-contact (not illustrated) that pierces the silicon substrate 10. Thereby, the same potential as that of the drain electrode 11 is applied to the terminal electrode 13 when driving the power semiconductor device 1.

Multiple cell trenches 15 are made in an upper surface 10a of the silicon substrate 10 in the cell region Rc. One terminal trench 16 is made in a region of the upper surface 10a that includes the boundary between the cell region Rc and the terminal region Rt. The terminal trench 16 has a frame-like configuration along the outer edge of the silicon substrate 10 as viewed from above. The width of the terminal trench 16 is wider than the width of the cell trench 15; and the depth of the terminal trench 16 is deeper than the depth of the cell trench 15. In other words, the lower end of the terminal trench 16 is positioned lower than the lower end of the cell trench 15.

In the silicon substrate 10, an n+-type substrate 21 (a first portion), an n−-type epitaxial layer 22 (a second portion), a p-type base layer 23 (a third portion), and an n+-type source layer 24 (a fourth portion) are stacked in order from substantially the lower layer side, i.e., the drain electrode 11 side. The n+-type substrate 21 and the n−-type epitaxial layer 22 are formed in both the cell region Rc and the terminal region Rt; and the p-type base layer 23 and the n+-type source layer 24 are formed in only the cell region Rc.

The conductivity type of the n+-type substrate 21 is the n type. The n−-type epitaxial layer 22 is disposed on the n+-type substrate 21. Although the conductivity type of the n−-type epitaxial layer 22 also is the n type, the effective impurity concentration of the n−-type epitaxial layer 22 is lower than the effective impurity concentration of the n+-type substrate 21. The drain layer includes the n+-type substrate 21 and the n−-type epitaxial layer 22. The p-type base layer 23 is provided on the n−-type epitaxial layer 22 in the cell region Rc; and the conductivity type of the p-type base layer 23 is the p type. The p-type base layer 23 is not formed outside the terminal trench 16, that is, in the terminal region Rt. The n+-type source layer 24 is selectively provided on the p-type base layer 23; and the conductivity type of the n+-type source layer 24 is the n type. The effective impurity concentration of the n+-type source layer 24 is higher than the effective impurity concentration of the n−-type epitaxial layer 22. In the specification, the concentration of the impurities contributing to the conduction of the semiconductor material is referred to as the effective impurity concentration. For example, in the case where both an impurity that forms donors and an impurity that forms acceptors are contained in the semiconductor material, the concentration of the portion excluding the cancelled portion of the donors and the acceptors is referred to as the effective impurity concentration.

The n+-type substrate 21 is exposed at the lower surface of the silicon substrate 10. Thereby, the n+-type substrate 21 is connected to the drain electrode 11. The p-type base layer 23 and the n+-type source layer 24 are exposed at the upper surface 10a of the silicon substrate 10 in the cell region Rc. Thereby, the p-type base layer 23 and the n+-type source layer 24 are connected to the source electrode 12. The n−-type epitaxial layer 22 is exposed at the upper surface of the silicon substrate 10 in the terminal region Rt. Therefore, the n−-type epitaxial layer 22 is connected to the terminal electrode 13.

A gate insulating film 31 made of an insulating material, e.g., silicon oxide, is formed on the inner surface of the cell trench 15. A gate electrode 32 made of a conductive material, e.g., polysilicon into which an impurity is introduced, is provided in the interior of the cell trench 15. The gate electrode 32 is separated from the silicon substrate 10 by the gate insulating film 31. The cell trench 15 pierces the p-type base layer 23 to reach the interior of the n−-type epitaxial layer 22. Accordingly, the n−-type epitaxial layer 22 and the p-type base layer 23 contact the gate insulating film 31. The n+-type source layer 24 also contacts the gate insulating film 31. An insulating film 33 is provided in the region directly above the gate electrode 32 between the silicon substrate 10 and the source electrode 12. Thereby, the gate electrode 32 is insulated from the source electrode 12 by the insulating film 33. By such a configuration, a vertical n-channel MOSFET 40 is formed of the n+-type substrate 21 and the n−-type epitaxial layer 22 (the drain layer), the p-type base layer 23, the n+-type source layer 24, the gate insulating film 31, and the gate electrode 32 in the cell region Rc.

On the other hand, an insulating member 36 is filled into the entire interior or substantially the entire interior of the terminal trench 16. The insulating member 36 is formed of an insulating material having a low dielectric constant, e.g., silicon oxide. The terminal trench 16 pierces the n−-type epitaxial layer 22 to reach the upper layer portion of the n+-type substrate 21. In other words, the lower end of the terminal trench 16 is positioned inside the n+-type substrate 21. Thereby, the side surface of the insulating member 36 on the cell region Rc side contacts the n+-type substrate 21, the n−-type epitaxial layer 22, and the p-type base layer 23. On the other hand, the side surface of the insulating member 36 on the terminal region Rt side contacts the n+-type substrate 21 and the n−-type epitaxial layer 22. Accordingly, the insulating member 36 is disposed between the p-type base layer 23 and the n−-type epitaxial layer 22 in the direction from the cell region Rc toward the terminal region Rt. The source electrode 12 overlays a portion of the insulating member 36 on the cell region Rc side as viewed from above; and the terminal electrode 13 overlays a portion of the insulating member 36 on the terminal region Rt side as viewed from above.

A distance L between the source electrode 12 and the terminal electrode 13 in the region directly above the insulating member 36 is a distance sufficient to obtain the breakdown voltage between the source electrode 12 and the terminal electrode 13. The breakdown voltage between the source electrode 12 and the terminal electrode 13 is higher than the breakdown voltage between the drain electrode 11 and the source electrode 12 in the cell region Rc.

The distance L (cm) can be calculated using formula (1) recited below:

$$L \text{ (cm)} = \alpha \times VD \text{ (V)}/VB \text{ (V/cm)} \quad (1)$$

where VB (V/cm) is the breakdown electric field of the material of the insulating member 36, VD (V) is the voltage applied between the drain electrode 11 and the source electrode 12, and α is a safety factor.

For example, in the case where the insulating material 36 is formed of silicon oxide, because the breakdown electric field VB of the silicon oxide is about $5 \times 10^6$ to $8 \times 10^6$ (V/cm), the distance L of formula (1) recited above is about 114 nm (nanometers) when the breakdown electric field VB is $7 \times 10^6$ (V/cm), the voltage VD is 40 (V), and the safety factor α is 2.

Operations of the power semiconductor device 1 according to the embodiment will now be described.

The prescribed voltage VD is supplied between the drain electrode 11 and the source electrode 12. At this time, a potential higher than that of the source electrode 12 is applied to the drain electrode 11. In other words, a low potential, e.g., 0 V, is applied to the source electrode 12; and a high potential, e.g., 40 V, is applied to the drain electrode 11. Thereby, the same high potential as that of the drain electrode 11 is applied also to the terminal electrode 13. At this time, the n+-type substrate 21 has the high potential (the drain potential) by being connected to the drain electrode 11; and the portion of the n−-type epitaxial layer 22 disposed in the terminal region Rt also has the high potential (the drain potential) by being connected to the terminal electrode 13. On the other hand, the p-type base layer 23 and the n+-type source layer 24 have the low potential (the source potential) by being connected to the source electrode 12. In this state, in the case where a potential lower than the threshold of the n-channel MOSFET 40 is applied to the gate electrode 32, a depletion layer extends from the interface between the n−-type epitaxial layer 22 and the p-type base layer 23 in the cell region Rc mainly into the n⁻-type epitaxial layer 22; and the n-channel MOSFET 40 is switched to the off-state.

A comparative example of the first embodiment will now be described.

Figure 2:
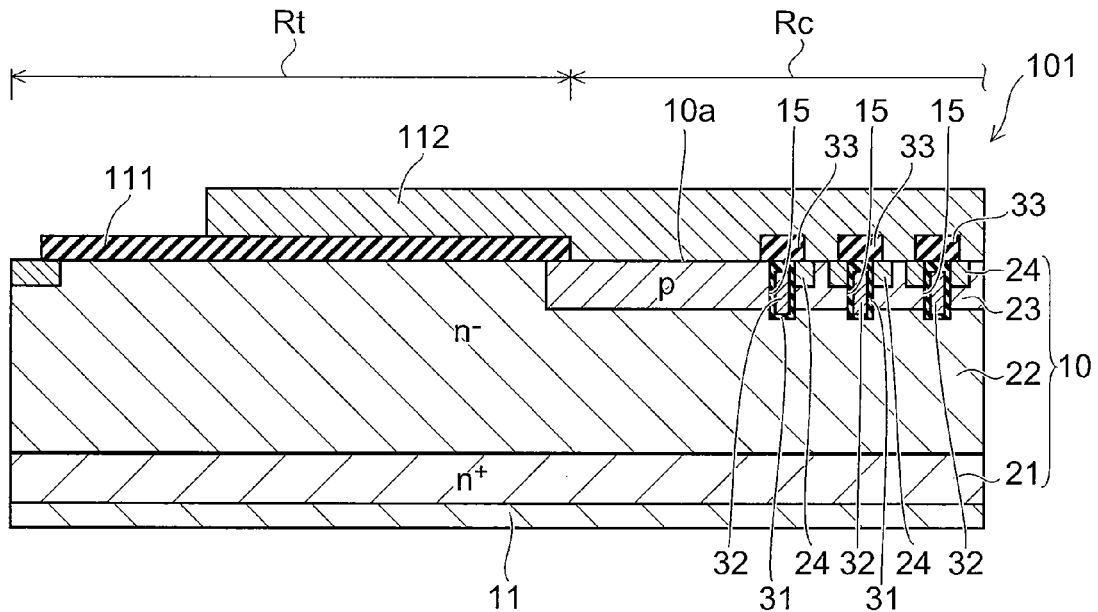
FIG. 2 is a cross-sectional view illustrating a power semiconductor device according to a comparative example.

FIG. 2 is a cross-sectional view illustrating a power semiconductor device according to this comparative example.

In the power semiconductor device 101 according to this comparative example as illustrated in FIG. 2, the terminal structure is a field plate structure. In other words, the device 101 differs from the device 1 according to the first embodiment described above (referring to FIG. 1) in that the terminal trench 16 and the insulating member 36 are not provided. Instead, in the terminal region Rt of the device 101, a field plate insulating film 111 is provided on the silicon substrate 10; and the end portion of a source electrode 112 extends onto a portion of the field plate insulating film 111.

Figure 3A:
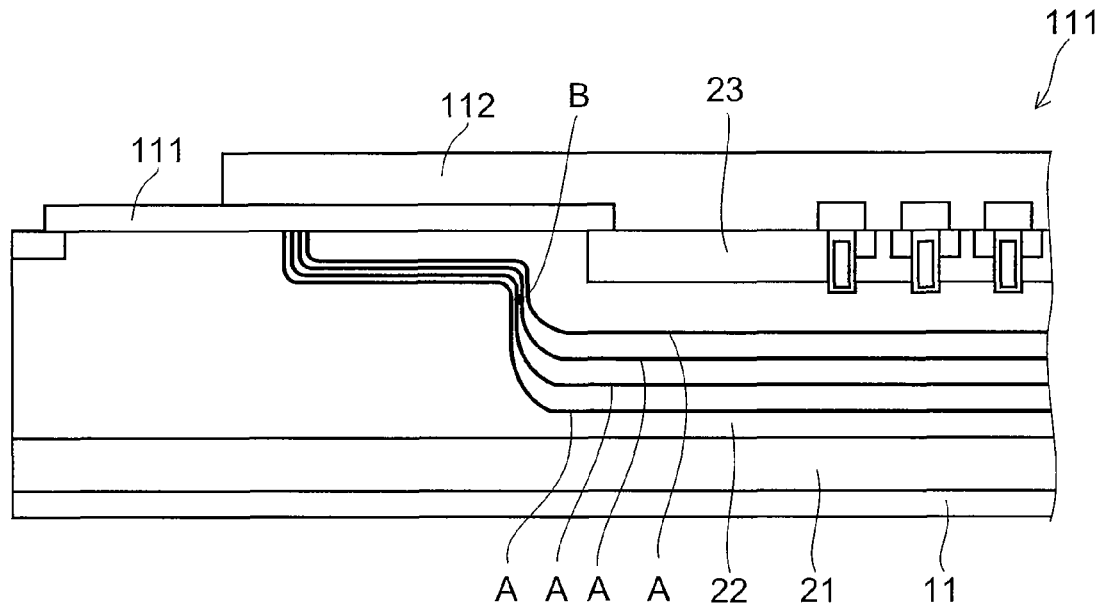
FIG. 3A illustrates the potential distribution inside the power semiconductor device according to the comparative example.
Figure 3B:
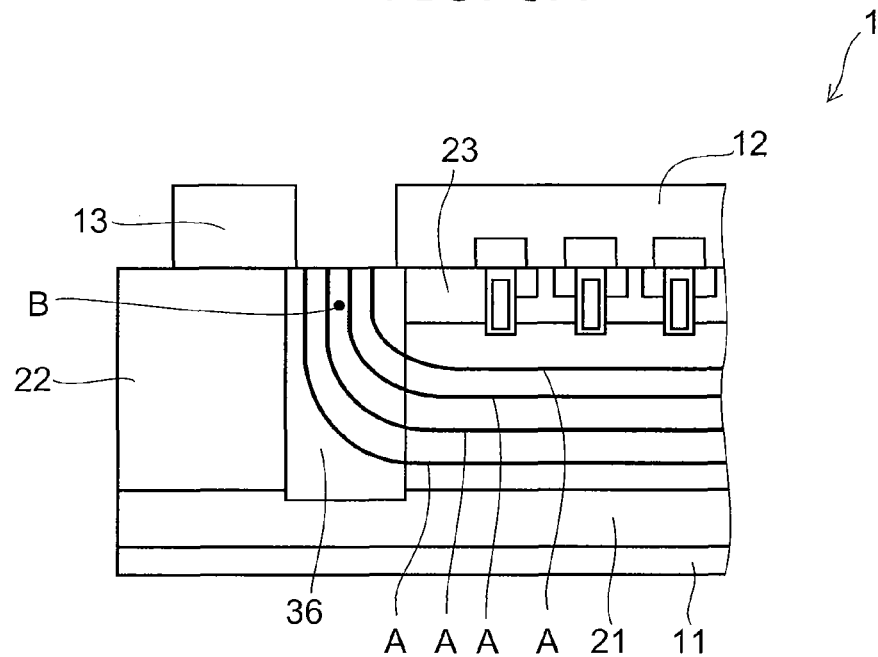
FIG. 3B illustrates the potential distribution inside the power semiconductor device according to the first embodiment.

FIG. 3A illustrates the potential distribution inside the power semiconductor device according to this comparative example; and FIG. 3B illustrates the potential distribution inside the power semiconductor device according to the first embodiment.

In the power semiconductor device 101 according to the comparative example as illustrated in FIG. 3A, a depletion layer (not illustrated) extends toward the outside from the cell trench 15 positioned at the outermost edge. Thereby, equipotential surfaces A are formed inside the n⁻-type epitaxial layer 22 along the interface between the n⁻-type epitaxial layer 22, the p-type base layer 23, and the field plate insulating film 111. Therefore, a point B where the electric field strength is highest, i.e., the point where the spacing of the equipotential surfaces A is shortest, is positioned in the n⁻-type epitaxial layer 22.

On the other hand, in the terminal region Rt of the power semiconductor device 1 according to the first embodiment as illustrated in FIG. 3B, the potential of the n⁻-type epitaxial layer 22 in the terminal region Rt is the same high potential (the drain potential) as that of the drain electrode 11 due to the existence of the terminal electrode 13. Because the p-type base layer 23 does not exist in the terminal region Rt, the depletion layer does not extend outside the terminal trench 16. As a result, the equipotential surfaces A are formed in the interior of the n⁻-type epitaxial layer 22 and the interior of the insulating member 36 between the entire n⁺-type substrate 21 which has the drain potential, the portion of the n⁻-type epitaxial layer 22 which has the drain potential and is disposed in the terminal region Rt (referring to FIG. 1), and the p-type base layer 23 which has the source potential. Inside the n⁻-type epitaxial layer 22, the equipotential surfaces A are substantially parallel to the lower surface of the silicon substrate 10; and inside the insulating member 36, the equipotential surfaces A curve from the direction substantially parallel to the lower surface of the silicon substrate 10 to a direction substantially perpendicular to the lower surface of the silicon substrate 10. Thereby, the point B where the electric field strength is highest is positioned inside the insulating member 36.

Thus, in the comparative example, the point B is positioned in the n⁻-type epitaxial layer 22; and in the first embodiment, the point B is positioned inside the insulating member 36. The n⁻-type epitaxial layer 22 is formed of a semiconductor material, e.g., silicon, which has an avalanche energy of about $2\times10^5$ to $3\times10^5$ V/cm. On the other hand, the insulating member 36 is formed of an insulating material, e.g., silicon oxide, which has a breakdown electric field of about $5\times10^6$ to $8\times10^6$ V/cm which is several tens of times greater than the avalanche energy of silicon. Therefore, according to the first embodiment, a high terminal breakdown voltage can be realized by the point B being positioned inside the insulating member 36.

In formula (1) recited above, the distance L between the source and the drain shortens as the breakdown electric field VB increases. According to the embodiment, the distance L can be shorter by disposing the point B inside the insulating member 36 which has a high breakdown strength. As a result, the width of the terminal region Rt can be narrower; and the surface area of the cell region Rc can be increased by this amount. Accordingly, the on-resistance of the power semiconductor device 1 can be reduced.

In the first embodiment, the lower end of the terminal trench 16 is positioned inside the n⁺-type substrate 21; and the insulating member 36 reaches a position inside the n⁺-type substrate 21. Thereby, the n⁻-type epitaxial layer 22 is removed from between the n⁺-type substrate 21 and the insulating member 36; and the point B where the electric field strength is highest can be reliably positioned inside the insulating member 36. The lower end of the terminal trench 16 may be positioned inside the n⁻-type epitaxial layer 22.

A second embodiment will now be described.

Figure 4:
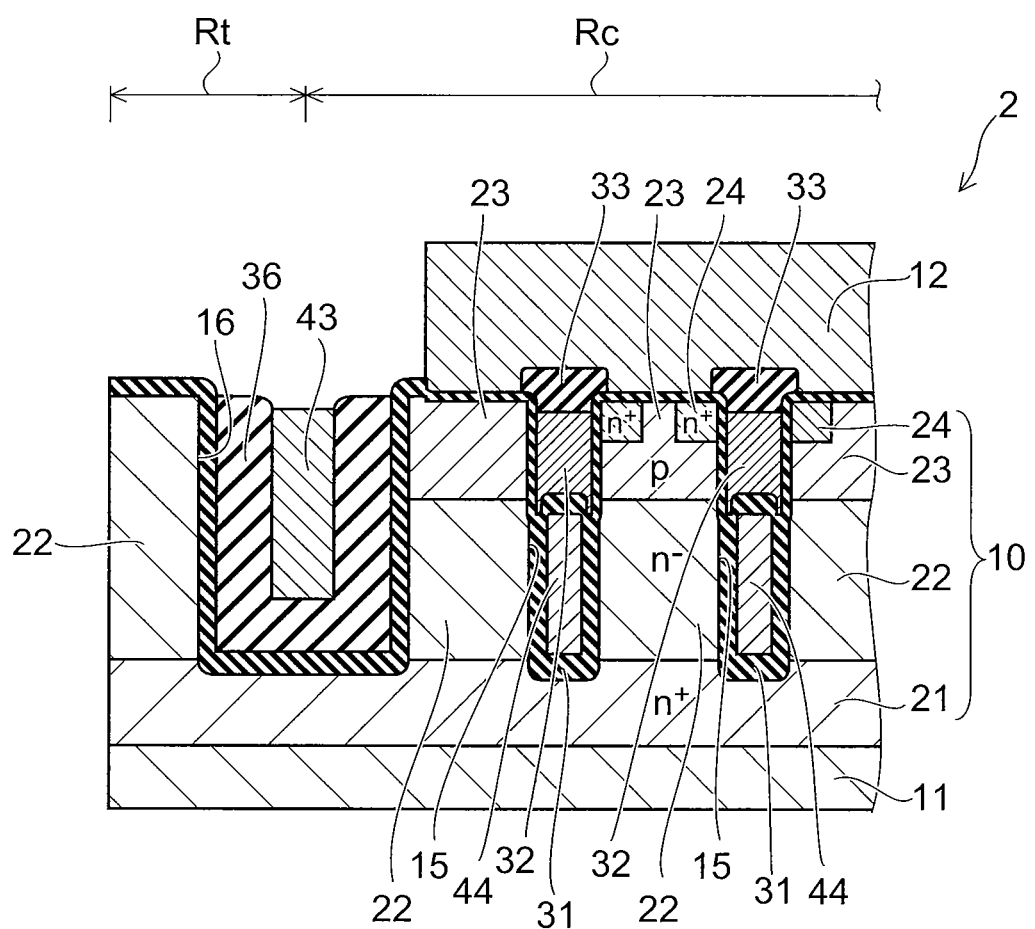
FIG. 4 is a cross-sectional view illustrating a power semiconductor device according to a second embodiment.

FIG. 4 is a cross-sectional view illustrating a power semiconductor device according to the embodiment.

As illustrated in FIG. 4, the power semiconductor device 2 according to the embodiment differs from the power semiconductor device 1 according to the first embodiment described above (referring to FIG. 1) in that the terminal electrode 13 is not provided on the silicon substrate 10, a terminal electrode 43 is provided inside the terminal trench 16, and a buried electrode 44 is provided below the gate electrode 32 inside the cell trench 15.

Details will now be described.

In the power semiconductor device 2, the insulating member 36 is not filled into the entire interior of the terminal trench 16 and is disposed along the inner surface of the terminal trench 16. However, the thickness of the insulating member 36 is thicker than the film thickness of the gate insulating film 31. The terminal electrode 43 is filled into the central portion inside the terminal trench 16. The terminal electrode 43 is formed of a conductive material, e.g., polysilicon into which an impurity is introduced. The terminal electrode 43 is separated from the silicon substrate 10 by the insulating member 36. One potential selected from the same potential (the drain potential) as that of the drain electrode 11, the same potential (the source potential) as that of the source electrode 12, and the same potential (the gate potential) as that of the gate electrode 32 may be applied to the terminal electrode 43; and the one potential that is applied may be switched among these potentials.

The lower end of the cell trench 15 reaches the interior of the n⁺-type substrate 21; the gate electrode 32 is disposed in the portion inside the cell trench 15 around which the p-type base layer 23 is provided; and the buried electrode 44 is disposed in the portion inside the cell trench 15 around which the n⁻-type epitaxial layer 22 is provided. The buried electrode 44 is formed of a conductive material, e.g., polysilicon into which an impurity is introduced; and the same potential as that of the source electrode 12 is applied to the buried electrode 44 when driving the power semiconductor device 2.

Otherwise, the configuration of the embodiment is similar to that of the first embodiment described above. In other words, in the embodiment as well, at least the lower end of the terminal trench 16 reaches the interior of the n⁺-type substrate 21. The p-type base layer 23 is not formed outside the terminal trench 16, that is, in the terminal region Rt. The lower end of the cell trench 15 may be positioned inside the n⁻-type epitaxial layer 22 without reaching the interior of the n⁺-type substrate 21. The buried electrode 44 may not be provided.

Operations of the power semiconductor device 2 according to the embodiment will now be described.

Figure 5A:
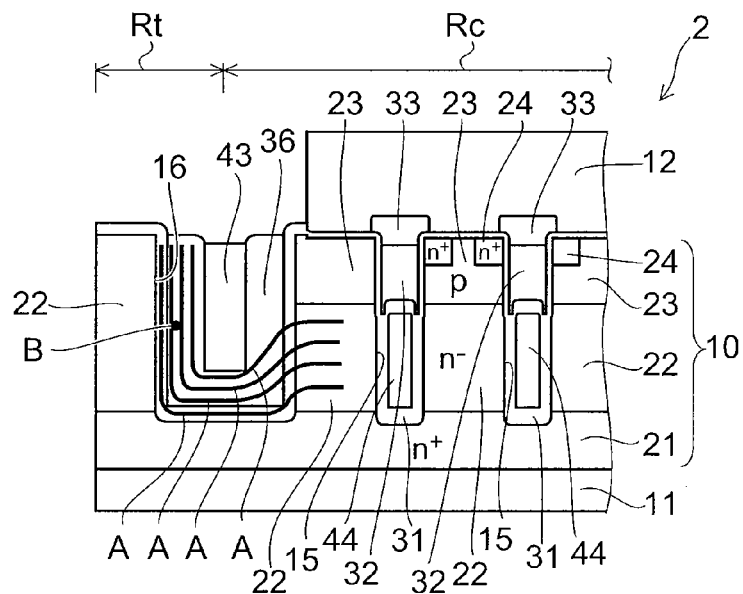
FIGS. 5A to 5C illustrate potential distributions inside the power semiconductor device according to the second embodiment.
Figure 5B:
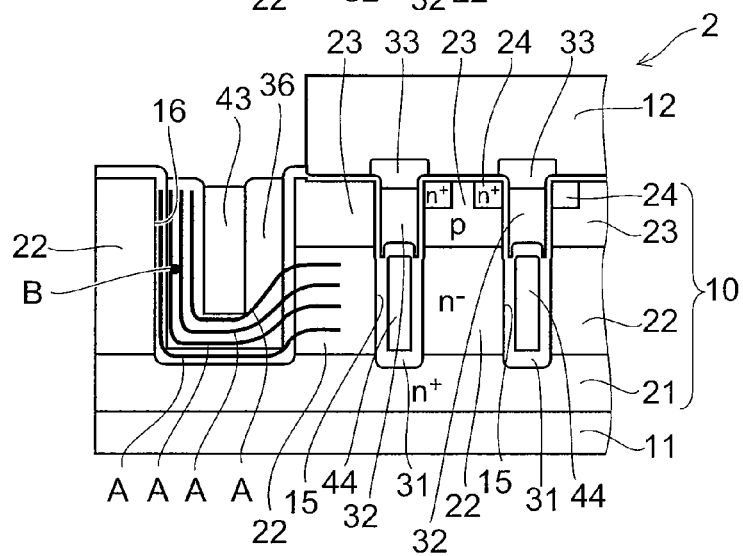
Figure 5C:
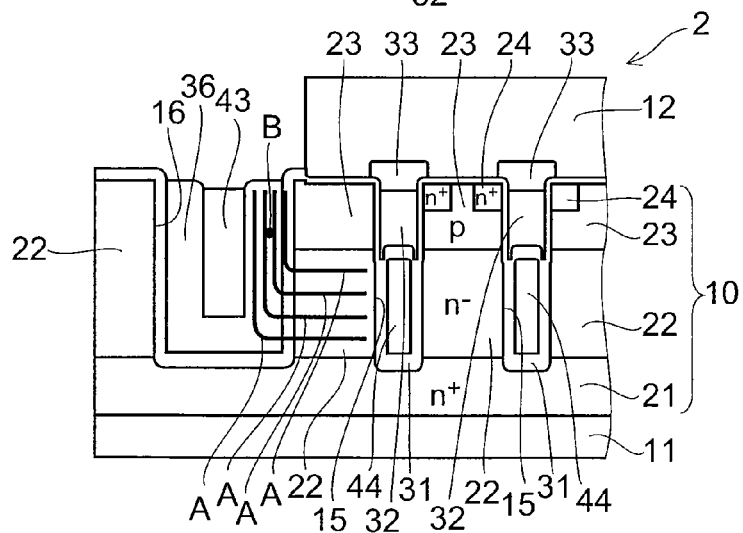

FIGS. 5A to 5C illustrate potential distributions inside the power semiconductor device according to the embodiment. FIG. 5A illustrates the case where the source potential is applied to the terminal electrode; FIG. 5B illustrates the case where the gate potential is applied to the terminal electrode; and FIG. 5C illustrates the case where the drain potential is applied to the terminal electrode.

In the case where the source potential is applied to the terminal electrode 43 as illustrated in FIG. 5A, the equipotential surfaces A are formed between the p-type base layer 23 and the terminal electrode 43 which have the source potential and the entire n⁺-type substrate 21 and the portion of the n⁻-type epitaxial layer 22 disposed in the terminal region Rt which have the drain potential. As a result, the point B where the electric field strength is highest is positioned between the terminal electrode 43 and the portion of the n⁻-type epitaxial layer 22 disposed in the terminal region Rt and accordingly is positioned inside the portion of the insulating member 36 on the terminal region Rt side. Thereby, the terminal breakdown voltage is increased due to reasons similar to those of the first embodiment described above.

Also in the case where the gate potential is applied to the terminal electrode 43 as illustrated in FIG. 5B, the equipotential surfaces A are formed in positions similarly to the case illustrated in FIG. 5A. This is because normally, in the case where the n-channel MOSFETs of the cell region Rc are in the off-state, a potential substantially equal to the source potential, e.g., 0 V, is applied to the gate electrode 32. As a result, the point B is positioned inside the portion of the insulating member 36 on the terminal region Rt side. Thereby, the terminal breakdown voltage increases.

In the case where the drain potential is applied to the terminal electrode 43 as illustrated in FIG. 5C, the equipotential surfaces A are formed between the p-type base layer 23 which has the source potential and the n⁺-type substrate 21 and the terminal electrode 43 which have the drain potential. As a result, the point B where the electric field strength is highest is positioned between the terminal electrode 43 and the p-type base layer 23 and accordingly is positioned inside the portion of the insulating member 36 on the cell region Rc side. Thereby, the terminal breakdown voltage is increased.

Thus, in the embodiment as well, similarly to the first embodiment described above, the terminal breakdown voltage can be increased by the point B where the electric field strength is highest being positioned inside the insulating member 36. Further, the width of the terminal region Rt can be reduced; the surface area of the cell region Rc can be increased by this amount; and the on-resistance can be reduced.

According to the embodiments described above, a power semiconductor device in which the breakdown voltage of the terminal region is high can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A power semiconductor device, a cell region and a terminal region being set in the device, the device comprising:
   a first electrode;
   a semiconductor substrate provided on the first electrode, a cell trench being in an upper surface of the semiconductor substrate in the cell region, a terminal trench being in the upper surface of the semiconductor substrate in a region including a boundary between the cell region and the terminal region, a width of the terminal trench being wider than a width of the cell trench;
   a second electrode provided on the semiconductor substrate in the cell region;
   a third electrode contacting the upper surface of the semiconductor substrate in the terminal region, the third electrode being separated from the second electrode;
   a gate insulating film provided on an inner surface of the cell trench;
   a gate electrode provided in an interior of the cell trench; and
   an insulating member entirely filling the terminal trench such that conductive material is not within an interior of the terminal trench,
   the semiconductor substrate including:
      a first portion of a first conductivity type provided in both the cell region and the terminal region, the first portion being connected to the first electrode;
      a second portion of the first conductivity type provided on the first portion in both the cell region and the terminal region and contacting the gate insulating film and the insulating member, an effective impurity concentration of the second portion being lower than an effective impurity concentration of the first portion;
      a third portion of a second conductivity type provided on the second portion in the cell region and contacting the gate insulating film, the third portion being connected to the second electrode; and
      a fourth portion of the first conductivity type selectively provided on the third portion and contacting the gate insulating film, the fourth portion being connected to the second electrode, and
   the insulating member being disposed between the third portion and the second portion in a direction from the cell region toward the terminal region.

2. The device according to claim 1, wherein the second electrode overlays a first portion of the insulating member which is within the cell region as viewed from a direction orthogonal to the upper surface of the semiconductor substrate, and the third electrode overlays a second portion of the insulating member which is within the terminal region as viewed from the direction orthogonal to the upper surface of the semiconductor substrate.

3. The device according to claim 1, wherein a lower end of the terminal trench is positioned lower than a lower end of the cell trench.

4. The device according to claim 1, wherein the semiconductor substrate is formed of silicon including an impurity, and the insulating member is formed of silicon oxide.

5. The device according to claim 1, wherein:
   the first conductivity type is an n type;
   the second conductivity type is a p type; and
   a potential higher than a potential of the second electrode is applied to the first electrode.

6. The device according to claim 1, wherein the third electrode is connected to the first electrode.

7. The device according to claim 2, wherein the second portion of the insulating member is within the terminal trench.

* * * * *